(12) United States Patent
Kwon et al.

(10) Patent No.: US 9,645,460 B2
(45) Date of Patent: May 9, 2017

(54) LIQUID CRYSTAL DISPLAY AND METHOD FOR MANUFACTURING THE SAME

(71) Applicant: Samsung Display Co., Ltd., Yongin, Gyeonggi-Do (KR)

(72) Inventors: Pil Sook Kwon, Incheon (KR); Yong Seok Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/012,569

(22) Filed: Feb. 1, 2016

(65) Prior Publication Data

US 2016/0291433 A1 Oct. 6, 2016

(30) Foreign Application Priority Data

Mar. 31, 2015 (KR) ........................ 10-2015-0045221

(51) Int. Cl.
*G02F 1/1333* (2006.01)
*G02F 1/1362* (2006.01)
*H01L 27/12* (2006.01)
*G02F 1/1368* (2006.01)
*G02F 1/1341* (2006.01)

(52) U.S. Cl.
CPC ...... *G02F 1/136209* (2013.01); *G02F 1/1341* (2013.01); *G02F 1/1368* (2013.01); *G02F 1/133345* (2013.01); *G02F 1/133377* (2013.01); *G02F 1/136286* (2013.01); *H01L 27/1259* (2013.01); *G02F 2001/136222* (2013.01)

(58) Field of Classification Search
CPC ......... G02F 1/136209; G02F 1/133345; G02F 1/133377
USPC .......................................................... 349/106
See application file for complete search history.

(56) References Cited

U.S. PATENT DOCUMENTS

2012/0062448 A1* 3/2012 Kim .................. G02F 1/133377
345/55

FOREIGN PATENT DOCUMENTS

| KR | 10-2013-0042307 | 4/2013 |
| KR | 10-2013-0120168 | 11/2013 |
| KR | 10-2014-0025081 | 3/2014 |

\* cited by examiner

*Primary Examiner* — Lucy Chien
(74) *Attorney, Agent, or Firm* — Innovation Counsel LLP

(57) ABSTRACT

A liquid crystal display includes: a substrate; a reference electrode disposed on the substrate; a reference electrode passivation layer disposed on the reference electrode; a thin film transistor disposed on the reference electrode passivation layer; a pixel electrode connected to the thin film transistor; a pixel electrode passivation layer disposed on a portion of the pixel electrode; a light blocking member disposed on the pixel electrode passivation layer; a color filter disposed so as to face the pixel electrode; a micro cavity disposed between the pixel electrode and the color filter; and a liquid crystal material disposed in the micro cavity.

16 Claims, 24 Drawing Sheets

LIQUID CRYSTAL DISPLAY AND METHOD FOR MANUFACTURING THE SAME

CROSS-REFERENCE TO RELATED APPLICATION

This application claims priority to and the benefit of Korean Patent Application No. 10-2015-0045221 filed in the Korean Intellectual Property Office on Mar. 31, 2015, the entire contents of which are incorporated herein by reference.

BACKGROUND (a) Technical Field

The present inventive concept relates to a liquid crystal display and a method for manufacturing the same.

(b) Description of the Related Art

A liquid crystal display, which is one of flat panel displays that are currently used widely, includes two display panels on which electric field generating electrodes such as pixel electrodes, common electrodes, and the like, are formed, and a liquid crystal layer interposed between the two display panels.

A voltage is applied to the electric field generating electrodes to generate an electric field in the liquid crystal layer, thereby determining alignment of liquid crystal molecules of the liquid crystal layer and controlling polarization of incident light to display an image.

The two display panels configuring the liquid crystal display may be a thin film transistor display panel and a counter display panel. Gate lines transmitting gate signals and data lines transmitting data signals may be formed on the thin film transistor display panel so as to intersect with each other, and thin film transistors connected to the gate lines and the data lines, pixel electrodes connected to the thin film transistors, and the like, may be formed on the thin film transistor display panel. A light blocking member, color filters, common electrodes, and the like, may be formed on the counter display panel. In addition, in some cases, the light blocking member, the color filters, the common electrodes, and the like, may also be formed on the thin film transistor display panel.

In the liquid crystal display as described above, two substrates are necessarily used, and the respective components are formed on the two substrates. Therefore, the liquid crystal display is heavy and thick, a high cost is required for manufacturing the liquid crystal display, and a long process time is required.

The above information disclosed in this Background section is only for enhancement of understanding of the background of the inventive concept and therefore it may contain information that does not form the prior art that is already known in this country to a person of ordinary skill in the art.

SUMMARY

The present inventive concept has been made in an effort to provide a liquid crystal display having advantages of using one substrate.

The present inventive concept has also been made in an effort to provide a method for manufacturing a liquid crystal display having advantages of decreasing the number of processes by using one substrate.

An exemplary embodiment of the present inventive concept provides a liquid crystal display including:

a substrate;
a reference electrode disposed on the substrate; a reference electrode passivation layer disposed on the reference electrode;
a thin film transistor disposed on the reference electrode passivation layer;
a pixel electrode connected to the thin film transistor;
a pixel electrode passivation layer disposed on a portion of the pixel electrode;
a light blocking member disposed on the pixel electrode passivation layer;
a color filter disposed so as to face the pixel electrode;
a micro cavity disposed between the pixel electrode and the color filter; and
a liquid crystal material disposed in the micro cavity.

The pixel electrode may directly contact one terminal of the thin film transistor.

The pixel electrode passivation layer and the light blocking member may be disposed on the thin film transistor.

The liquid crystal display may further include an overcoat covering the light blocking member.

A side surface of the overcoat may be disposed on an extension line of a side surface of the pixel electrode passivation layer.

The liquid crystal display may further include a partition wall part partitioning the micro cavity, wherein the partition wall part is formed by the color filter.

The liquid crystal display may further include a data line connected to the thin film transistor, wherein the partition wall part is overlapped with the data line.

The pixel electrode passivation layer maybe disposed under the light blocking member to cover the pixel electrode.

A side surface of the overcoat may be positioned on an extension line of a side surface of the pixel electrode passivation layer.

The pixel electrode passivation layer may not be disposed on areas other than an area corresponding to the light blocking member.

The pixel electrode passivation layer may be made of a silicon nitride (SiNx) or a silicon oxide (SiOx).

Another exemplary embodiment of the present inventive concept provides a method for manufacturing a liquid crystal display including:

sequentially forming a reference electrode and a reference electrode passivation layer on a substrate including a display area displaying an image and a peripheral area disposed in the vicinity of the display area;
forming a gate line including a gate electrode on the reference electrode passivation layer;
forming a gate insulating layer on the gate line and the reference electrode passivation layer;
forming a semiconductor layer, a data line including a source electrode, and a drain electrode on the gate insulating layer;
forming a pixel electrode on the drain electrode and the gate insulating layer;
forming a preliminary pixel electrode passivation layer on the pixel electrode, the data line, the drain electrode, and the gate insulating layer;
forming a light blocking member on the preliminary pixel electrode passivation layer;
forming an insulating layer on the light blocking member and the preliminary pixel electrode passivation layer;

forming a pixel electrode passivation layer and an overcoat, respectively, by simultaneously etching the preliminary pixel electrode passivation layer and the insulating layer;

forming a sacrificial layer on the pixel electrode and the overcoat;

sequentially forming a lower insulating layer, a color filter, and an upper insulating layer on the sacrificial layer; exposing the sacrificial layer;

forming a micro cavity between the lower insulating layer and the pixel electrode by removing the sacrificial layer;

injecting a liquid crystal material into the micro cavity; and forming a capping layer on the upper insulating layer to seal the micro cavity.

The forming of the pixel electrode passivation layer and the overcoat may further include forming a reference electrode exposing hole exposing a portion of the reference electrode by etching the reference electrode passivation layer and the gate insulating layer of the peripheral area.

Etching the preliminary pixel electrode passivation layer and the insulating layer and etching the reference electrode passivation layer and the gate insulating layer of the peripheral area may use a same mask.

The method for manufacturing a liquid crystal display may further include, before the forming of the capping layer, forming a reference electrode pad on the gate insulating layer, the reference electrode pad contacting the reference electrode through the reference electrode exposing hole.

The overcoat may cover the light blocking member, and the pixel electrode passivation layer may be formed between the light blocking member and the pixel electrode.

According to an exemplary embodiment of the present inventive concept, the pixel electrode passivation layer is formed between the light blocking member and the pixel electrode to prevent the moisture permeating into the lower portion of the light blocking member from contacting the pixel electrode, thereby making it possible to prevent the pixel electrode from being corroded.

In addition, since the pixel electrode passivation layer, the overcoat, and the reference electrode exposing hole are formed using one mask rather than using the respective masks, the number of masks used at the time of manufacturing the liquid crystal display may be decreased.

DETAILED DESCRIPTION OF THE EMBODIMENTS

Figure 1:
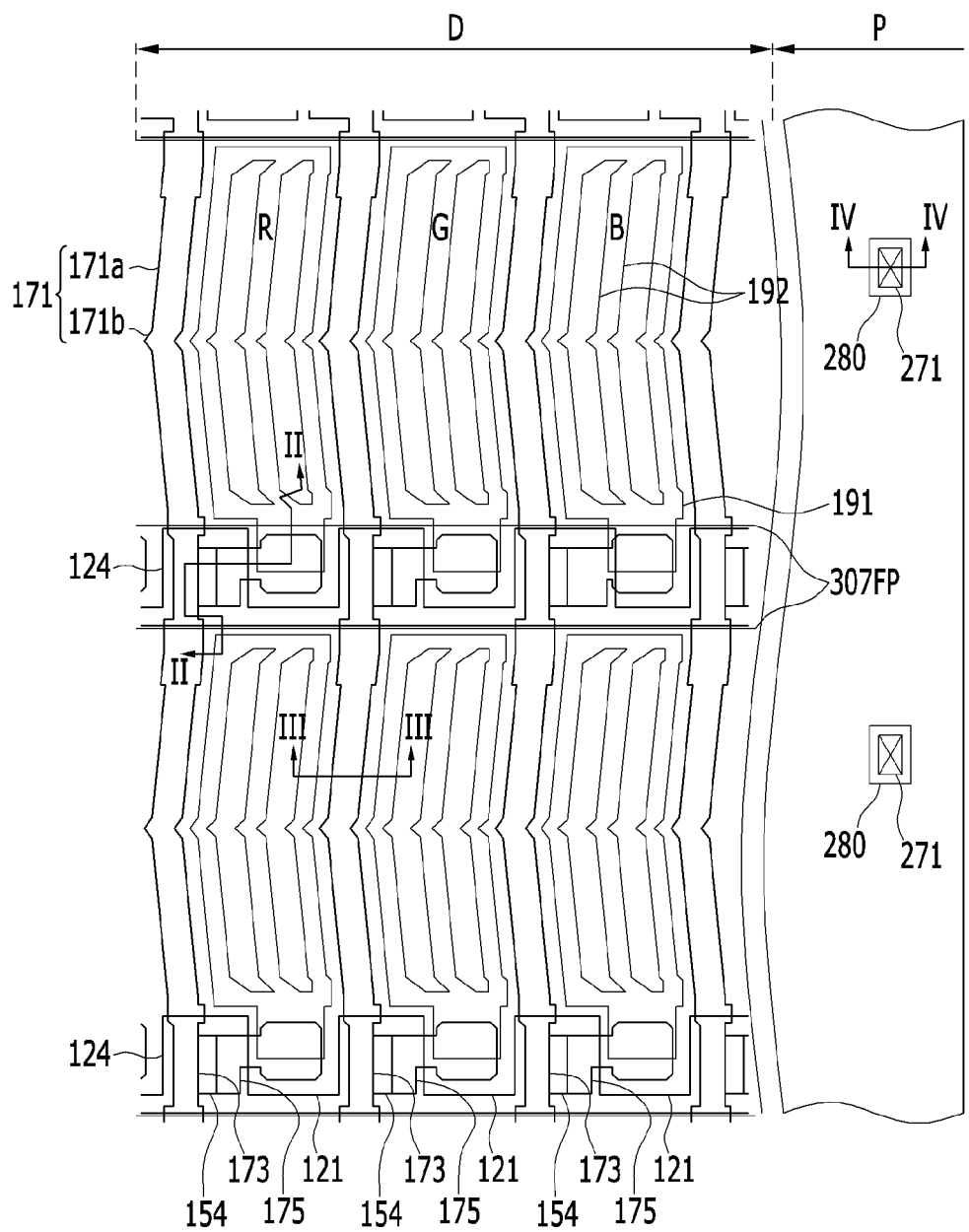
FIG. 1 is a plan view showing a liquid crystal display according to an exemplary embodiment of the present inventive concept.

Hereinafter, several exemplary embodiments of the present inventive concept will be described in detail with reference to the accompanying drawings so that those skilled in the art to which the present inventive concept pertains may easily practice the present inventive concept. However, the present inventive concept may be implemented in various different forms and is not limited to exemplary embodiments provided herein.

Portions unrelated to the description will be omitted in order to obviously describe the present inventive concept, and similar components will be denoted by the same reference numerals throughout the present specification.

In addition, since sizes and thicknesses of the respective components shown in the accompanying drawings are arbitrarily shown for convenience of explanation, the present inventive concept is not necessarily limited to contents shown in the accompanying drawings.

In the drawings, the thickness of layers, films, panels, regions, etc., are exaggerated for clarity. In addition, in the accompanying drawings, thicknesses of some of layers and regions have been exaggerated for convenience of explanation. It will be understood that when an element such as a layer, film, region, or substrate is referred to as being "on" another element, it can be directly on the other element or intervening elements may also be present.

In addition, throughout the present specification, unless explicitly described to the contrary, the word "comprise" and variations such as "comprises" or "comprising" will be understood to imply the inclusion of stated elements but not the exclusion of any other elements. In addition, throughout the specification, the word "on" does not necessarily mean that any element is disposed at an upper side based on a gravity direction, but means that any element is disposed above or below a target portion.

Further, throughout the specification, the word "on the plane" means the case in which a target is viewed from the top, and the word "on the cross section" means the case in which a cross section of a target taken along a vertical direction is viewed from the side.

Figure 2:
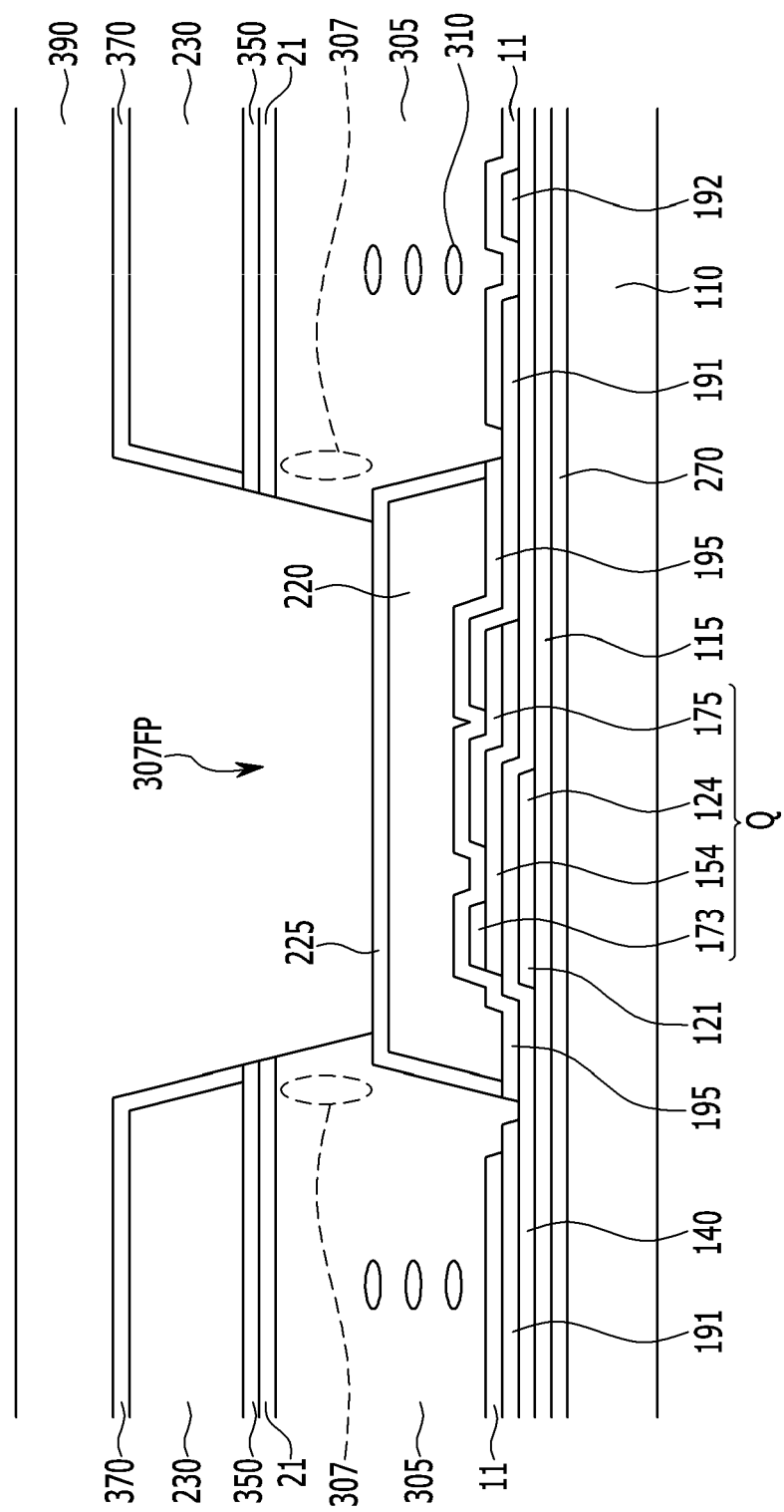
FIG. 2 is a cross-sectional view taken along line II-II of FIG. 1.
Figure 3:
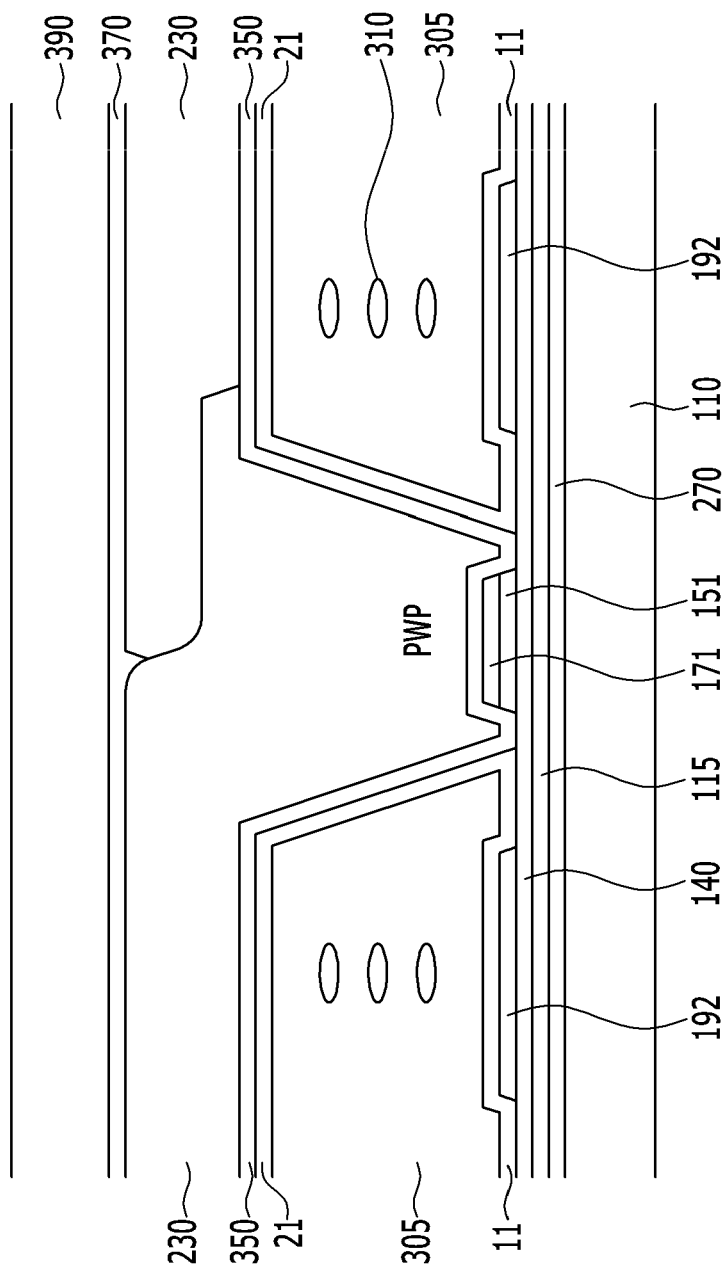
FIG. 3 is a cross-sectional view taken along line III-III of FIG. 1.
Figure 4:
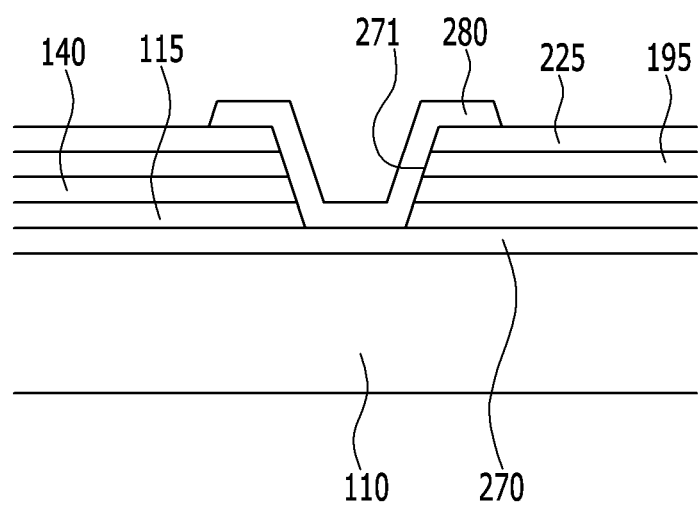
FIG. 4 is a cross-sectional view taken along line IV-IV of FIG. 1.

FIG. 1 is a plan view showing a liquid crystal display according to an exemplary embodiment of the present inventive concept. FIG. 2 is a cross-sectional view taken along line II-II of FIG. 1. FIG. 3 is a cross-sectional view taken along line of FIG. 1. FIG. 4 is a cross-sectional view taken along line IV-IV of FIG. 1.

FIG. 1 shows a 3×2 pixel area, which is a portion of a plurality of pixel areas included in the liquid crystal display according to an exemplary embodiment of the present inventive concept. The 3×2 pixel areas may be repeatedly arranged in all directions.

Referring to FIGS. 1 to 4, the liquid crystal display according to the present exemplary embodiment includes a display area D displaying an image and a peripheral area P disposed in the vicinity of the display area D.

A plurality of gate lines 121, a plurality of data lines 171, and a plurality of pixels arranged in a matrix form are disposed in the display area D. The pixels include a red pixel R, a green pixel G, and a blue pixel B.

A liquid crystal inlet 307FP is disposed between pixels adjacent to each other in a vertical direction. That is, the liquid crystal inlet 307FP extends in a horizontal direction. The liquid crystal inlet 307FP divides a micro cavity 305 to be described below. Here, one micro cavity 305 is disposed so as to correspond to one pixel or a plurality of pixels.

A driver (not shown) applying driving signals to the gate lines 121 and the data lines 171 is disposed in the peripheral area P. The driver may include a gate driver applying gate signals to the gate lines 121 and a data driver applying data signals to the data lines 171. In addition, the peripheral area P includes reference electrode pads 280 contacting reference electrodes 270 to be described below. The reference electrode pads 280 receive a reference voltage applied from the outside and transfer the reference voltage to the reference electrodes 270.

Next, a structure of the liquid crystal display according to the present exemplary embodiment will be described in detail.

The reference electrodes 270 are disposed on a substrate 110 made of transparent glass, plastic, or the like, and a reference electrode passivation layer 115 is disposed on the reference electrodes 270.

The reference electrodes 270 may be disposed in the display area D and the peripheral area P, have a planar shape, may be formed of an integrated plate that is not split and has an integrated shape, on a front surface of the substrate 110. The reference electrodes 270 may receive the reference voltage applied from the outside through reference electrode pads 280 to be described below.

The reference electrode passivation layer 115 may be made of a silicon nitride (SiNx), a silicon oxide (SiOx), or the like.

The gate lines 121 are disposed on the reference electrode passivation layer 115, and a gate insulating layer 140 is disposed on the gate lines 121.

The gate lines 121 transfer the gate signals, and include gate pads (not shown) for connection with gate electrodes 124 and other layers or drivers. The gate line 121 may be made of an aluminum based metal such as aluminum (Al), an aluminum alloy, or the like, a silver based metal such as silver (Ag), a silver alloy, or the like, a copper based metal such as copper (Cu), a copper alloy, or the like, a molybdenum based metal such as molybdenum (Mo), a molybdenum alloy, or the like, chromium (Cr), tantalum (Ta) and titanium (Ti), or the like. However, the gate line 121 may also have a multilayer structure including at least two conductive layers having different physical properties.

The gate insulating layer 140 may be made of a silicon nitride (SiNx), a silicon oxide (SiOx), or the like.

The reference electrode passivation layer 115 and the gate insulating layer 140 include reference electrode exposing holes 271 exposing portions of the reference electrodes 270. The reference electrode exposing holes 271 are disposed in the peripheral area P.

A semiconductor layer 151 is disposed on the gate insulating layer 140. The semiconductor layer 151 includes protrusion parts 154 overlapped with the gate electrodes 124. The semiconductor layer 151 may be made of amorphous silicon, polysilicon, or an oxide semiconductor.

The data lines 171 including source electrodes 173 and drain electrodes 175 are disposed on the semiconductor layer 151.

The data lines 171 transfer the data signals, and intersect with the gate lines 121. In addition, the data lines 171 include data pads (not shown) for connection with other layers or drivers. The source electrodes 173 are portions of the data lines 171, and are disposed on the same lines as the data lines 171. The drain electrodes 175 are formed so as to extend in parallel with the source electrodes 173. Therefore, the drain electrodes 175 are in parallel with portions of the data lines 171. These structures of the source electrodes 173 and the drain electrodes 175 may be modified.

The data line 171 and the drain electrode 175 are preferably made of a refractory metal such as molybdenum, chromium, tantalum, titanium, and the like, or an alloy thereof, and may have a multilayer structure including a refractory metal layer (not shown) and a low resistance conductive layer (not shown). An example of the multilayer structure may include a double layer of a chromium or molybdenum (alloy) lower layer and an aluminum (alloy) upper layer and a triple layer of a molybdenum (alloy) lower layer, an aluminum (alloy) intermediate layer, and a molybdenum (alloy) upper layer.

Here, the data lines 171 may have first bent parts 171a having a bent shape in order to obtain maximum transmittance of the liquid crystal display, wherein the first bent parts 171a may meet each other in an intermediate area of the pixel area to form a V shape. The intermediate area of the pixel area may further include second bent parts 171b bent so as to form a predetermined angle with respect to the first bent parts 171a.

The first bent parts 171a of the data lines 171 may be bent so as to form an angle of about 7 degrees with respect to a vertical reference line forming an angle of 90 degrees with respect to a direction in which the gate lines 121 extend. The second bent parts 171b disposed in the intermediate area of the pixel area may be further bent so as to form an angle of about 7 degrees to about 15 degrees with respect to the first bent parts 171a.

The gate electrode 124, the source electrode 173, and the drain electrode 175 form one thin film transistor Q together with the protrusion part 154 of the semiconductor layer 151, and a channel of the thin film transistor Q is formed in the protrusion part 154 of the semiconductor layer 151 between the source electrode 173 and the drain electrode 175.

Ohmic contact members serving to lower contact resistances between the semiconductor layer 151 and the data line 171 and between the protrusion part 154 of the semiconductor layer 151 and the source electrode 173 and the drain electrode 175 may be disposed between them. Meanwhile, in the case in which the semiconductor layer 151 is made of an oxide semiconductor, the ohmic contact members may be omitted.

Pixel electrodes 191 are disposed on the drain electrodes 175 and the gate insulating layer 140. The pixel electrode 191 directly contacts the drain electrode 175, and receives a voltage applied from the drain electrode 175. The pixel electrode 191 includes a plurality of branch electrodes 192. In addition, the pixel electrode 191 may include a bent edge that is substantially in parallel with the bent parts of the first and second bent parts 171a and 171b of the data line 171.

The reference electrode pads 280 are disposed on the gate insulating layer 140 in the peripheral area P. The reference electrode pads 280 contact the reference electrodes 270 through the reference electrode exposing holes 271. The reference electrode pads 280 receive the reference voltage applied from the outside and transfer the reference voltage to the reference electrodes 270.

The pixel electrode 191 may form a horizontal electric field together with the reference electrode 270. The pixel electrode 191 and the reference electrode 270, which are electric field generating electrodes, generate an electric field, such that liquid crystal molecules 310 disposed on two electric field generating electrodes 191 and 270 rotate in a direction that is in parallel with a direction of the electric field. Polarization of light passing through a liquid crystal layer is changed depending on the rotation direction of the liquid crystal molecules 310 determined as described above.

The pixel electrode 191 and the reference electrode 270 may be made of a transparent conductive material such as an ITO, an IZO, or the like.

A light blocking member 220 is disposed above a portion of the pixel electrode 191 so as to cover a region in which the thin film transistor Q is formed. The light blocking member 220 according to the present exemplary embodiment may be formed in a direction in which the gate lines 121 extend. The light blocking member 220 may be made of a material that may block light.

A pixel electrode passivation layer 195 is disposed below the light blocking member 220. That is, the pixel electrode passivation layer 195 is disposed between the thin film transistor Q and the light blocking member 220. In addition, the pixel electrode passivation layer 195 is disposed between the light blocking member 220 and the pixel electrode 191. The pixel electrode passivation layer 195 is not disposed on areas other than an area corresponding to the light blocking member 220. The pixel electrode passivation layer 195 may be made of a silicon nitride (SiNx), a silicon oxide (SiOx), or the like.

An overcoat 225 is disposed on the light blocking member 220. The overcoat 225 covers the light blocking member 220. The overcoat 225 may be made of a silicon nitride (SiNx), a silicon oxide (SiOx), or the like. Here, the overcoat 225 covering a side surface of the light blocking member 220 contacts the pixel electrode passivation layer 195. A side surface of the overcoat 225 is disposed on an extension line of a side surface of the pixel electrode passivation layer 195.

A lower alignment layer 11 is formed on the pixel electrode 191, and may be a vertical alignment layer. The lower alignment layer 11, which is a liquid crystal alignment layer made of polyamic acid, polysiloxane, polyimide, or the like, may include at least one of generally used materials. In addition, the lower alignment layer 11 may also be a photo-alignment layer.

An upper alignment layer 21 is disposed at a portion facing the lower alignment layer 11, and the micro cavity 305 is formed between the lower alignment layer 11 and the upper alignment layer 21. A liquid crystal material including the liquid crystal molecules 310 is injected into the micro cavity 305, and the micro cavity 305 has an inlet 307. The micro cavity 305 may be formed in a column direction of the pixel electrodes 191, in other words, in the vertical direction. In the present exemplary embodiment, the liquid crystal material including an alignment material forming the upper and lower alignment layers 11 and 21 and the liquid crystal molecules 310 may be injected into the micro cavity 305 using capillary force. In the present exemplary embodiment, the lower alignment layer 11 and the upper alignment layer 21 are only distinguished from each other depending on their positions, and may be connected to each other, as shown in FIG. 3. The lower alignment layer 11 and the upper alignment layer 21 may be simultaneously formed.

The micro cavity 305 is divided in the vertical direction by a plurality of liquid crystal inlets 307FP disposed at portions overlapped with the gate line 121, such that a plurality of micro cavities 305 are formed. Here, the plurality of micro cavities 305 may be formed in the column direction of the pixel electrodes 191, in other words, the vertical direction. In addition, the micro cavity 305 is divided in the horizontal direction by a partition wall part PWP to be described below, such that a plurality of micro cavities 305 are formed. Here, the plurality of micro cavities 305 may be formed in a row direction of the pixel electrodes 191, in other words, in the horizontal direction in which the gate lines 121 extend.

In the liquid crystal display according to the present exemplary embodiment, each of the plurality of micro cavities 305 may correspond to one pixel area. The pixel area, which is a minimum unit showing a contrast, may correspond to an area which displays the smallest controllable element of a picture represented on a screen. However, the present inventive concept is not limited thereto. That is, each of the plurality of micro cavities 305 may also correspond to two or more pixel areas.

A lower insulating layer 350 is disposed on the upper alignment layer 21. The lower insulating layer 350 may be made of a silicon nitride (SiNx), a silicon oxide (SiOx), or the like.

Color filters 230 are disposed on the lower insulating layer 350. The color filters 230 may display one of primary colors such as three primary colors including a red, a green, and a blue. The color filter 230 serves as a roof layer supporting the micro cavity 305 so that the micro cavity 305 may be formed. In addition, as shown in FIG. 3, a color filter 230 of one color among color filters neighboring to each other may form the partition wall part PWP.

The partition wall part PWP is disposed between micro cavities 305 neighboring to each other in the horizontal direction. The partition wall part PWP is filled in a space between the micro cavities neighboring to each other in the horizontal direction. Although the partition wall part PWP is formed in a structure in which it is completely filled in the space between the micro cavities 305 as shown in FIG. 3, the partition wall part PWP is not necessarily limited thereto, but may also be formed in a structure in which it is filled in a portion of the space. The partition wall part PWP may be formed in the direction in which the data lines 171 extend while being overlapped with the data lines 171.

The color filters 230 neighboring to each other may be overlapped with each other above the partition wall part PWP. An interface on which the color filters 230 neighboring to each other meet each other may be disposed at a portion corresponding to the partition wall part PWP.

As described above, in the present exemplary embodiment, the color filters 230 and the partition wall part PWP serve to support the micro cavities 305 so that the micro cavities 305 may maintain their shapes.

An upper insulating layer 370 is disposed on the color filters 230. The upper insulating layer 370 may be made of a silicon nitride (SiNx), a silicon oxide (SiOx), or the like. As shown in FIG. 2, the upper insulating layer 370 may cover side surface portions of the color filters 230.

A capping layer 390 is disposed on the upper insulating layer 370. The capping layer 390 is also disposed at the liquid crystal inlet 307FP, and covers the inlets 307 of the micro cavities 305 exposed by the liquid crystal inlets 307FP. The capping layer 390 may include an organic material, an inorganic material, or a water-soluble polymer material. Although the case in which the liquid crystal material is removed in the liquid crystal inlet 307FP has been shown, the liquid crystal material remaining after being injected into the micro cavities 305 may also be present in the liquid crystal inlet 307FP.

Meanwhile, at the time of forming the capping layer 390, moisture permeates into a lower portion of the light blocking member 220, thereby making it possible to cause a defect such as corrosion of the pixel electrodes 191 disposed below the light blocking member 220. However, in the present exemplary embodiment, the pixel electrode passivation layer 195 is disposed between the light blocking members 220 and the pixel electrodes 191 to prevent the moisture permeating into the lower portion of the light blocking member 220 from contacting the pixel electrode 195, thereby making it possible to prevent the pixel electrodes 191 from being corroded.

In the present exemplary embodiment, as shown in FIG. 3, the partition wall part PWP is formed by the color filter 230 of one color between the micro cavities 305 neighboring to each other in the horizontal direction. The partition wall part PWP forms a partition wall, thereby making it possible to partition or define the micro cavities 305. In the present exemplary embodiment, since a partition wall structure such as the partition wall part PWP is present between the micro cavities 305, even though the substrate 110 is bent, stress is less generated, and a change degree of a cell gap may be decreased.

Next, a method for manufacturing a liquid crystal display according to an exemplary embodiment of the present inventive concept will be described with reference to FIGS. 5 to 24 and FIGS. 2 to 4. A method for manufacturing a liquid crystal display according to an exemplary embodiment of the present inventive concept to be described below may be modified into another form.

FIGS. 5 to 24 are cross-sectional views showing a method for manufacturing a liquid crystal display according to an exemplary embodiment of the present inventive concept. FIG. 5, FIG. 6, FIG. 8, FIG. 11, FIG. 14, FIG. 17, FIG. 19, FIG. 21, and FIG. 23 show cross-sectional views taken along line II-II of FIG. 1 depending on a sequence of the method for manufacturing a liquid crystal display. FIG. 7, FIG. 9, FIG. 12, FIG. 15, FIG. 18, FIG. 20, FIG. 22, and FIG. 24 show cross-sectional views taken along line of FIG. 1 depending on a sequence of the method for manufacturing a liquid crystal display. FIG. 10, FIG. 13, and FIG. 16 show cross-sectional views taken along line IV-IV of FIG. 1 depending on a sequence of the method for manufacturing a liquid crystal display.

Figure 5:
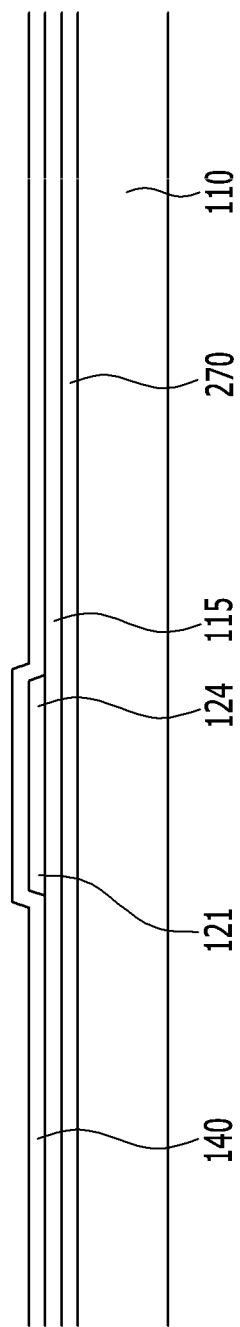
FIGS. 5, 6, 7, 8, 9, 10, 11, 12, 13, 14, 15, 16, 17, 18, 19, 20, 21, 22, 23 and 24 are cross-sectional views showing a method for manufacturing a liquid crystal display according to an exemplary embodiment of the present inventive concept.

Referring to FIG. 5, the reference electrodes 270 and the reference electrode passivation layer 115 are sequentially formed on the substrate 110, the gate lines 121 including the gate electrodes 124 are formed on the reference electrode passivation layer 115, and the gate insulating layer 140 is formed on the gate lines 121 and reference electrode passivation layer 115.

Figure 6:
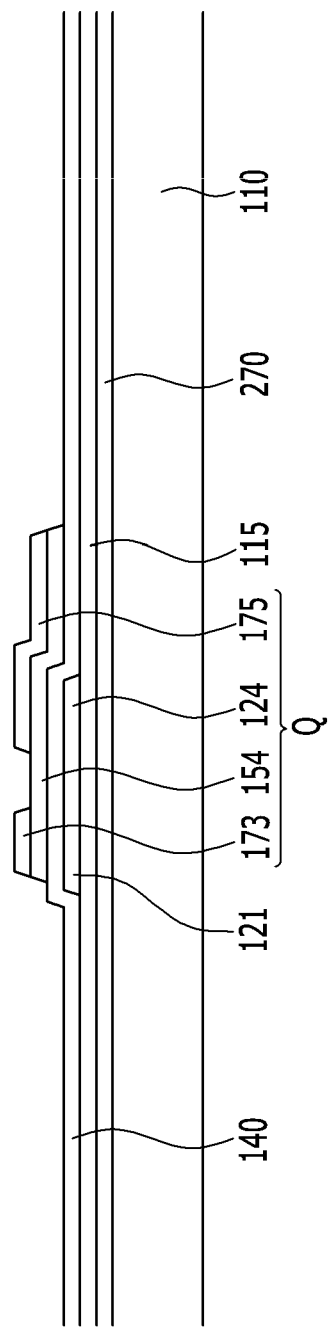
Figure 7:
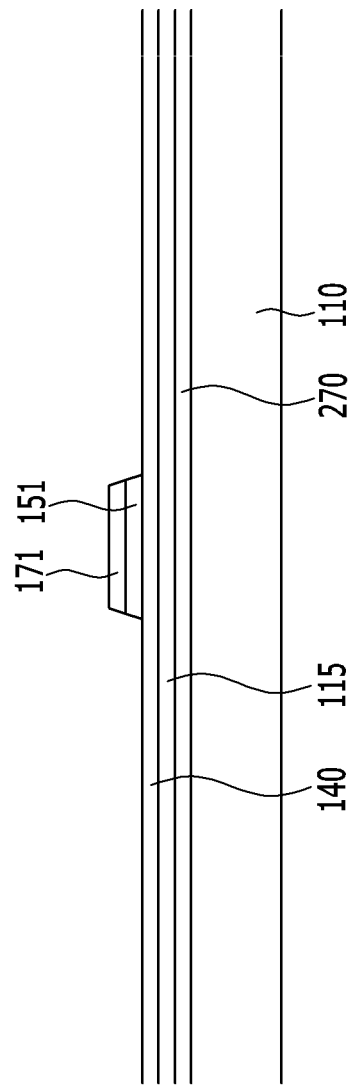

Referring to FIGS. 6 and 7, the semiconductor layer 151 including the protrusion parts 154, the data lines 171 including the source electrodes 173, and the drain electrodes 175 are formed on the gate insulating layer 140. Here, the thin film transistor Q is formed.

Figure 8:
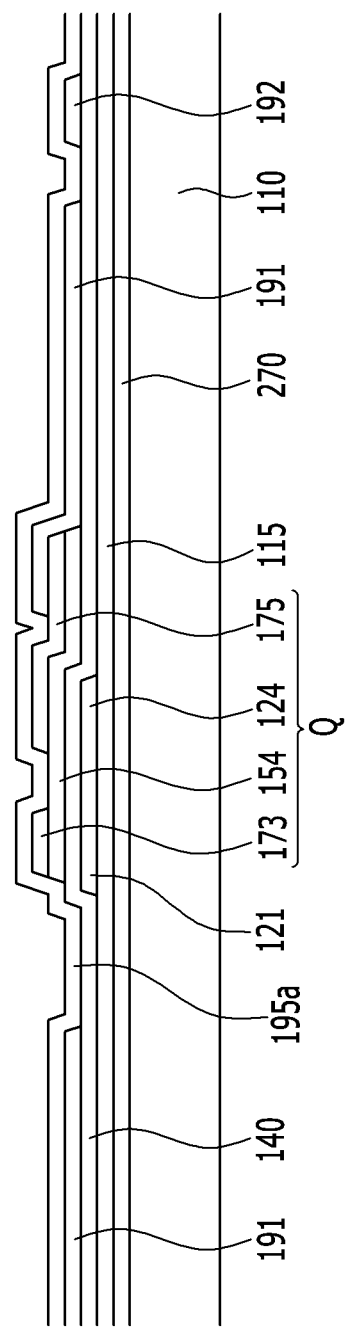
Figure 9:
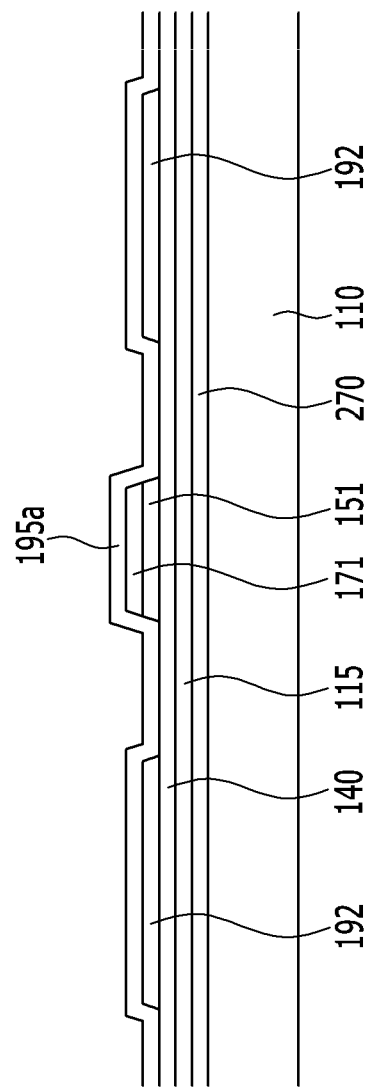
Figure 10:
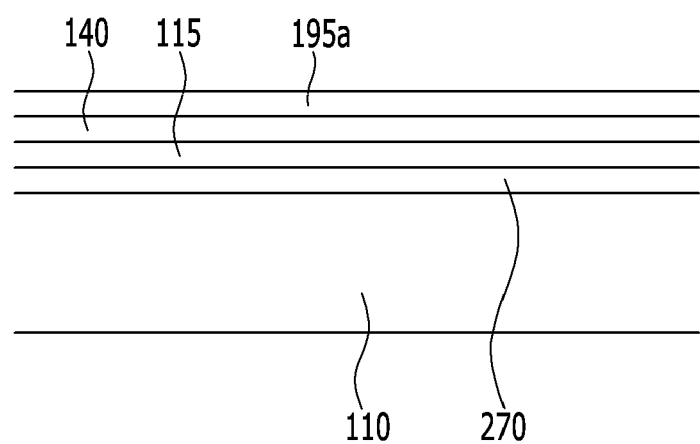

Referring to FIGS. 8 to 10, the pixel electrodes 191 including the plurality of branch electrodes 192 are formed on the drain electrodes 175 and the gate insulating layers 140, and a preliminary pixel electrode passivation layer 195a is formed on the pixel electrodes 191, the data lines 171, the drain electrodes 175, and the gate insulating layer 140. Here, the pixel electrode 191 directly contacts the drain electrode 175.

Figure 11:
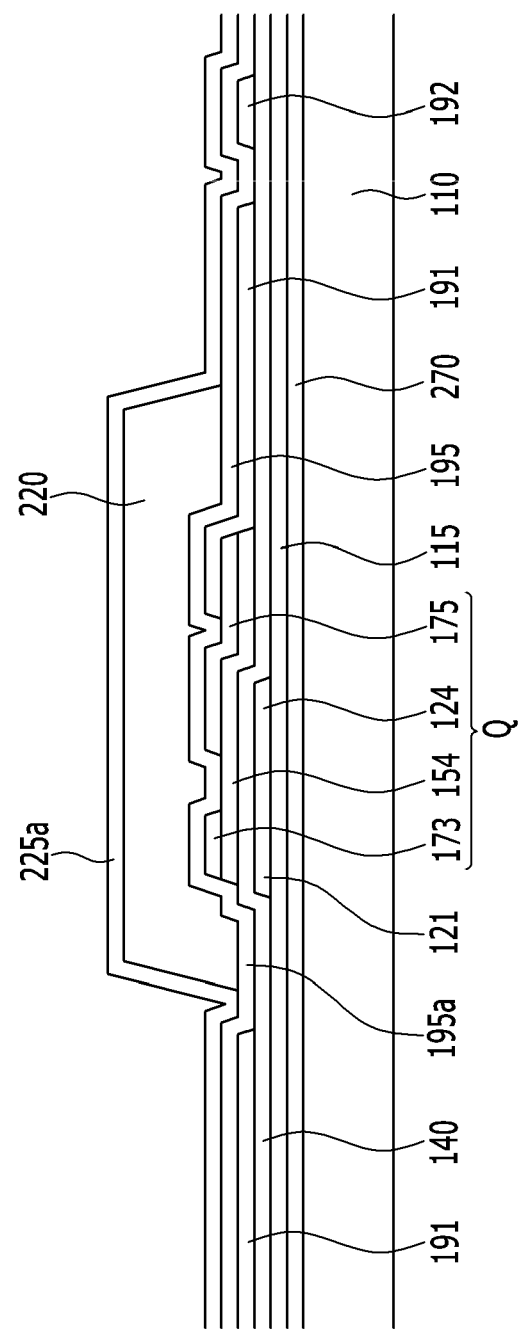
Figure 12:
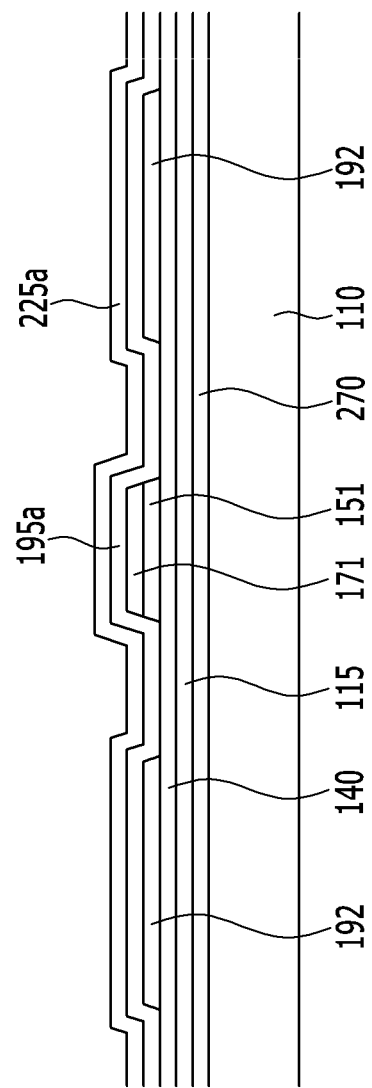
Figure 13:
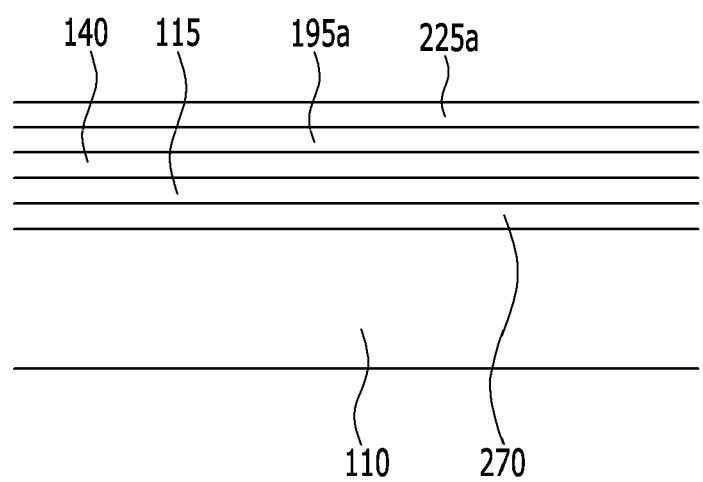

Referring to FIGS. 11 to 13, the light blocking member 220 is formed on the preliminary pixel electrode passivation layer 195a, and an insulating layer 225a is formed on the light blocking member 220 and the preliminary pixel electrode passivation layer 195a. Here, the light blocking member 220 is formed on a portion of the pixel electrode 191 so as to cover an area in which the thin film transistor Q is formed.

Figure 14:
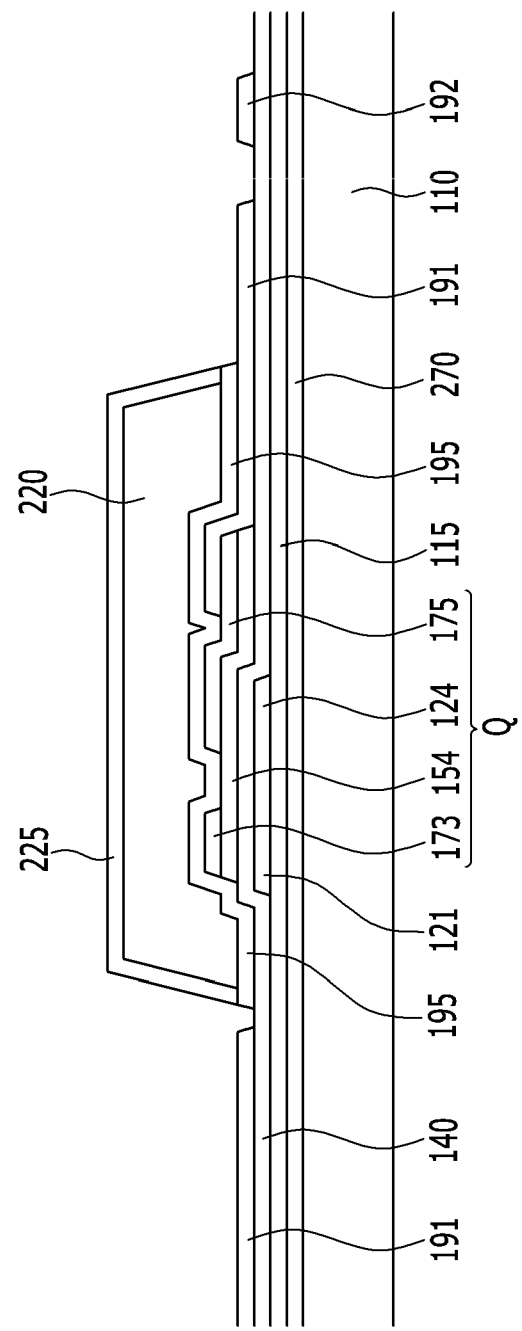
Figure 15:
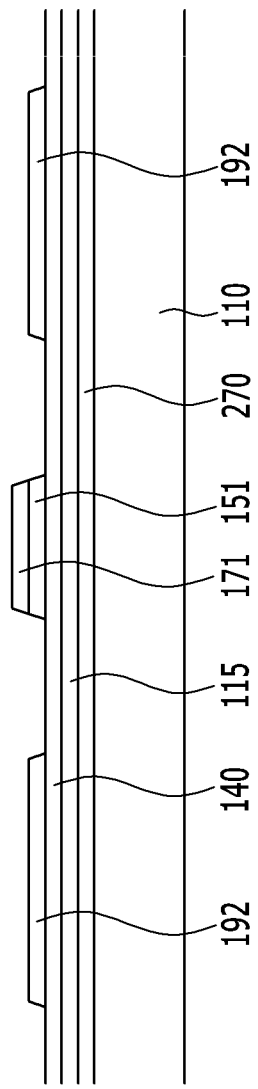
Figure 16:
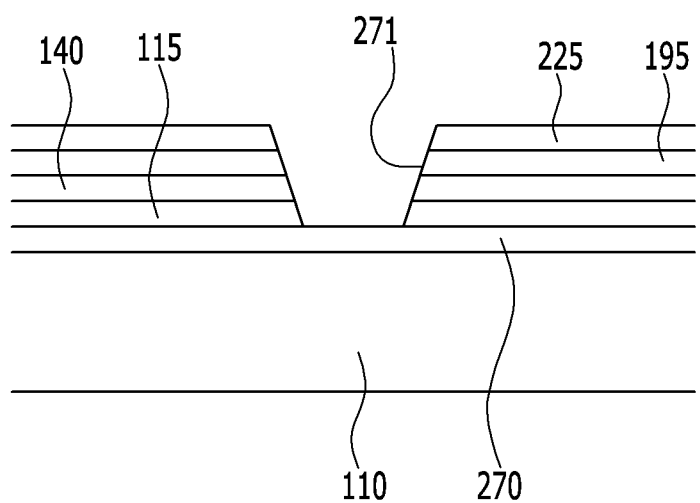

Referring to FIGS. 14 to 16, the preliminary pixel electrode passivation layer 195a and the insulating layer 225a are simultaneously etched to form the pixel electrode passivation layer 195 and the overcoat 225. During the etching process of the preliminary pixel electrode passivation layer 195a and the insulating layer 225a, the reference electrode passivation layer 115 and the gate insulating layer 140 are etched to form the reference electrode exposing holes 271 exposing the reference electrodes 270.

Here, the pixel electrode passivation layer 195 is formed between the thin film transistor Q and the light blocking member 220 and between the light blocking member 220 and the pixel electrode 191. In addition, the overcoat 225 is formed so as to cover the light blocking member 220. The pixel electrode passivation layer 195 prevents the moisture permeating into a lower portion of the light blocking member 220 from contacting the pixel electrode 191 in a subsequent process to prevent the pixel electrode 191 from being corroded.

Here, a process of simultaneously etching the preliminary pixel electrode passivation layer 195a and the insulating layer 225a and then forming the reference electrode exposing holes 271 is performed using one mask. Here, the mask may be a half-tone mask. Therefore, it may prevent to etch the reference electrode passivation layer 115 and gate insulating layer 140 between the pixel electrode 191 and the pixel electrode passivation layer 195, between the plurality of branch electrodes 192, and between the branch electrodes 192 and the data line 171.

As described above, since the pixel electrode passivation layer 195, the overcoat 225, and the reference electrode exposing hole 271 are formed using one mask rather than using the respective masks, the number of masks used at the time of manufacturing the liquid crystal display may be decreased.

Figure 17:
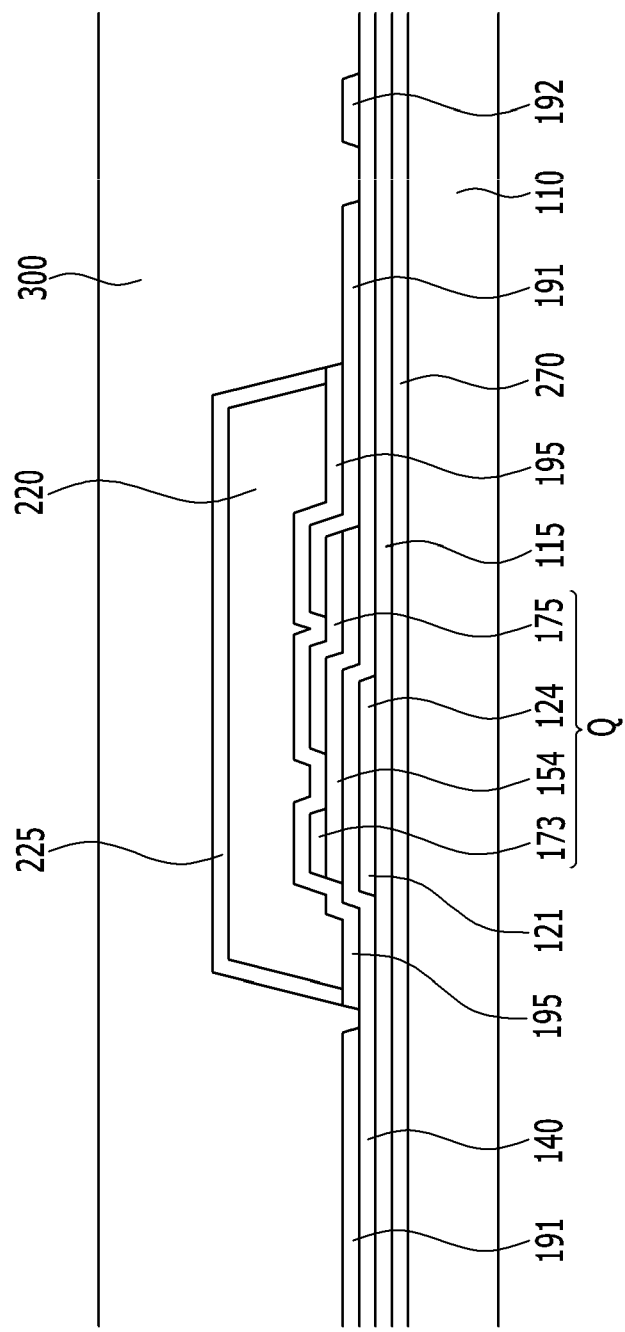
Figure 18:
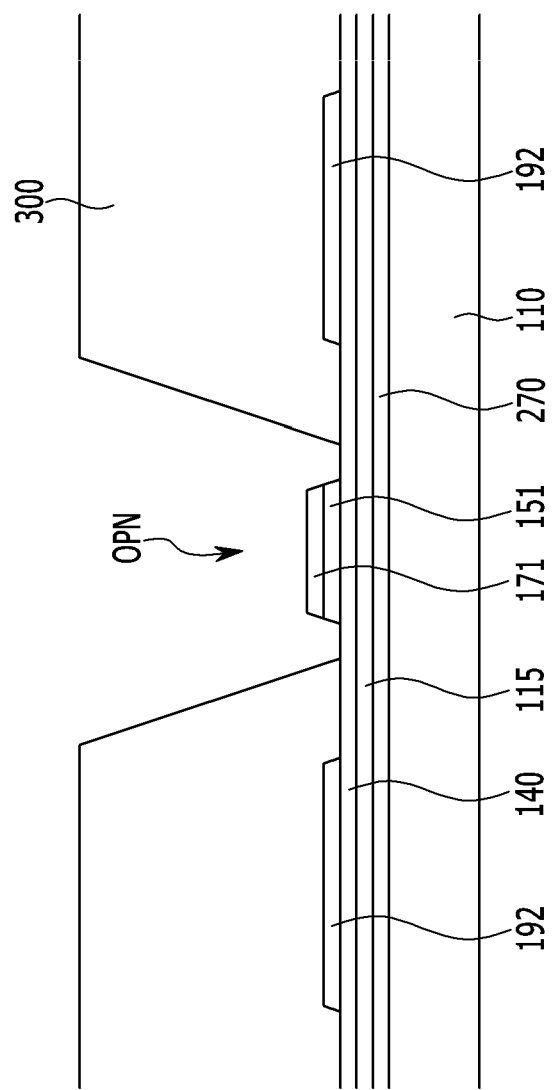

Referring to FIGS. 17 and 18, a sacrificial layer 300 is formed on the gate insulating layer 140, the pixel electrodes 191, and the overcoats 225. The sacrificial layer 300 has an open part OPN formed at a portion thereof corresponding to the data lines 171, as shown in FIG. 18.

Figure 19:
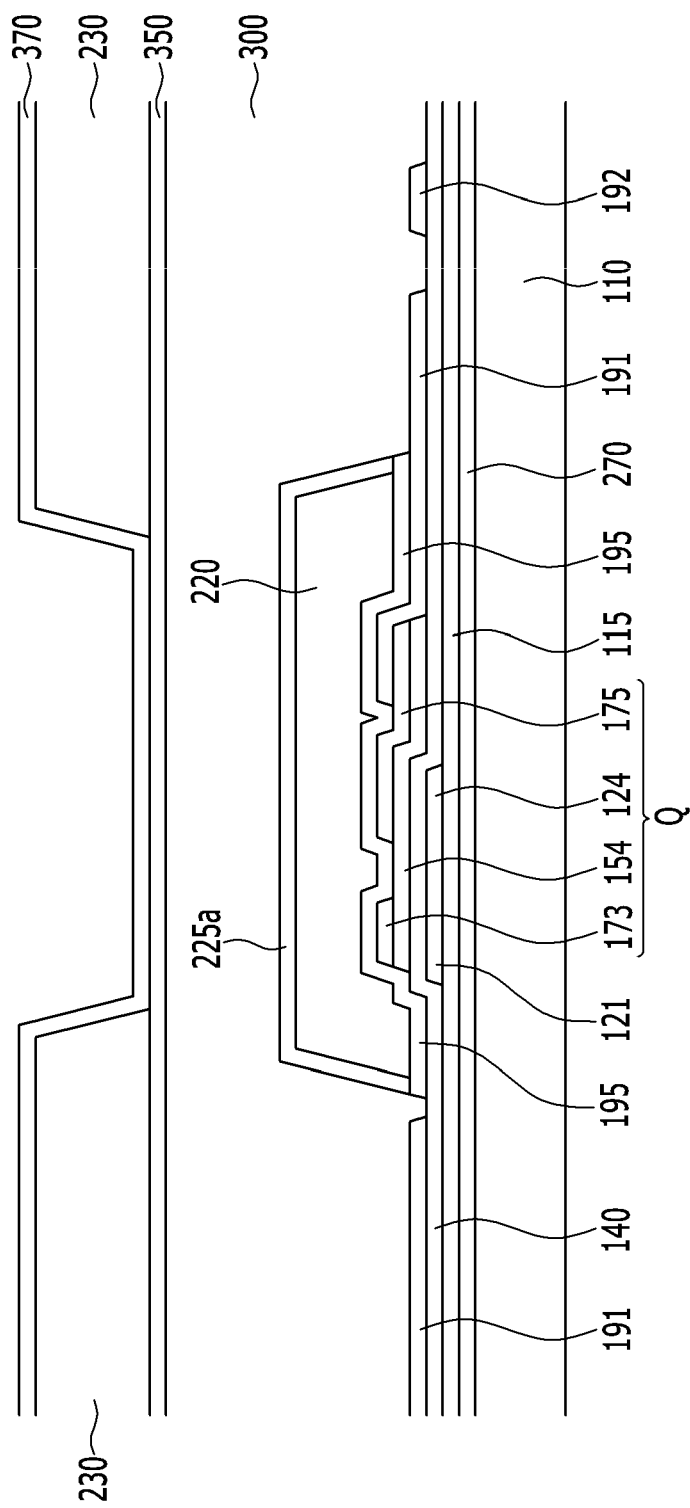
Figure 20:
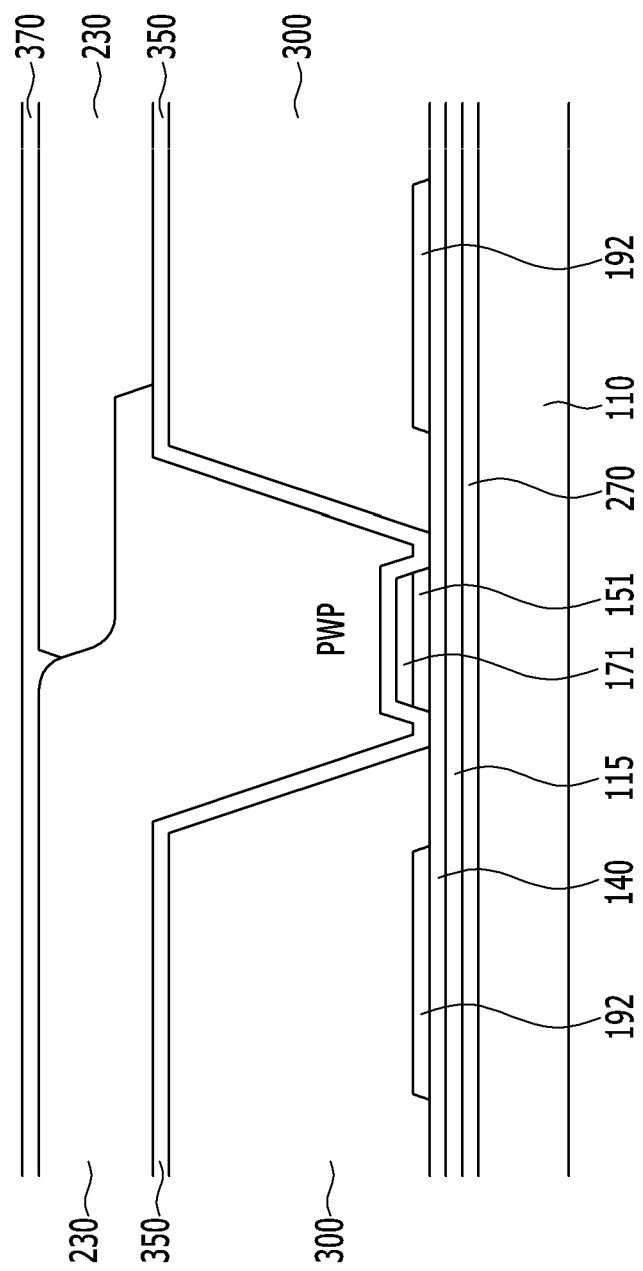

Referring to FIGS. 19 and 20, the lower insulating layer 350, the color filters 230, and the upper insulating layer 370 are sequentially formed on the sacrificial layer 300. Here, the lower insulating layer 350 is also formed on the data lines 171. In addition, the color filter 230 of one color among the color filters neighboring to each other forms the partition wall part PWP while being filled in the open part OPN.

Figure 21:
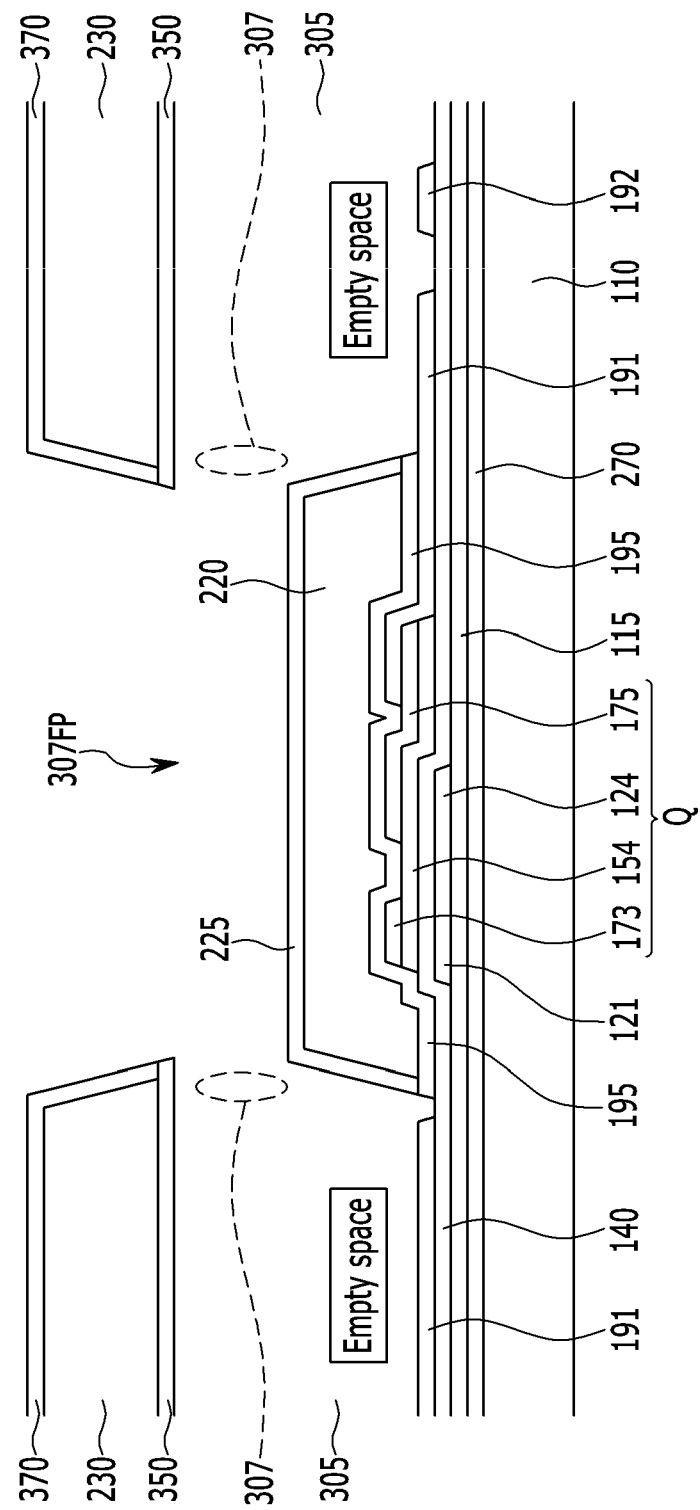
Figure 22:
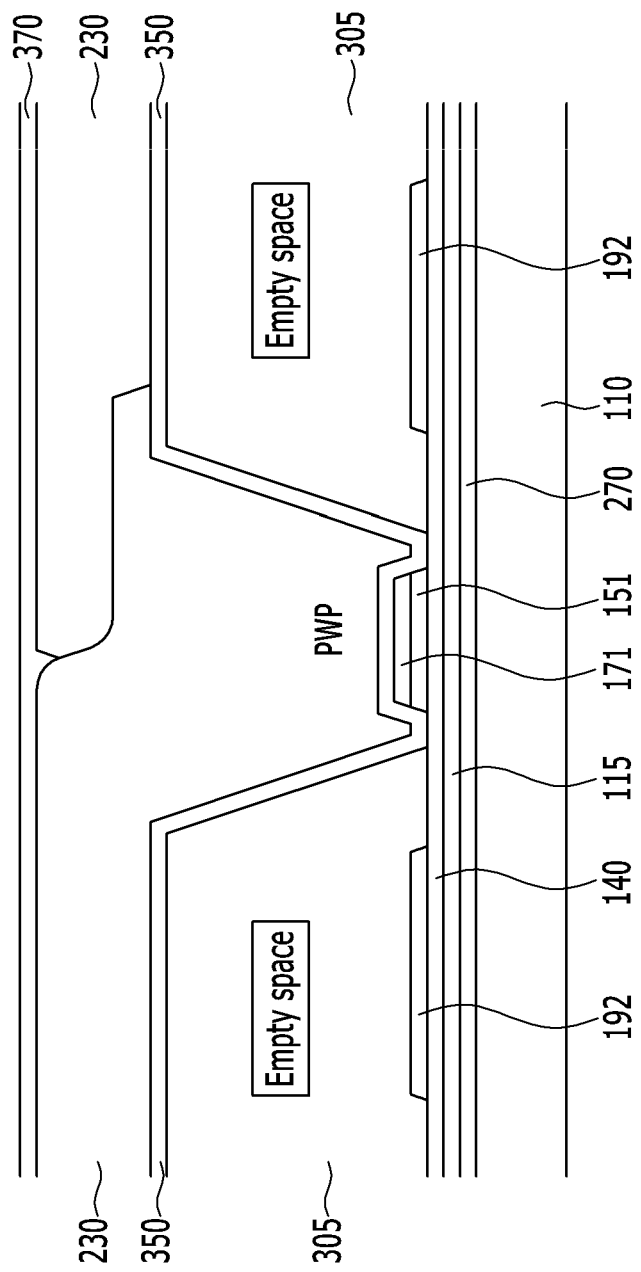

Referring to FIGS. 21 and 22, the lower insulating layer 350 is etched at portions corresponding to light blocking members 220 to form the liquid crystal inlets 307FP. In this case, a portion of the sacrificial layer 300 is exposed. Here, the lower insulating layer 350 may be etched by a dry etching process. Here, the upper insulating layer 370 has a structure in which it covers the side surface of the color filter 230.

Then, the sacrificial layer 300 is removed by ashing using oxygen ($O_2$) gas, a wet etching method, or the like, through the liquid crystal inlet 307FP. In this case, the micro cavities 305 having the inlets 307 are formed. The sacrificial layer 300 is removed, such that the micro cavities 305 are in an empty space state.

Figure 23:
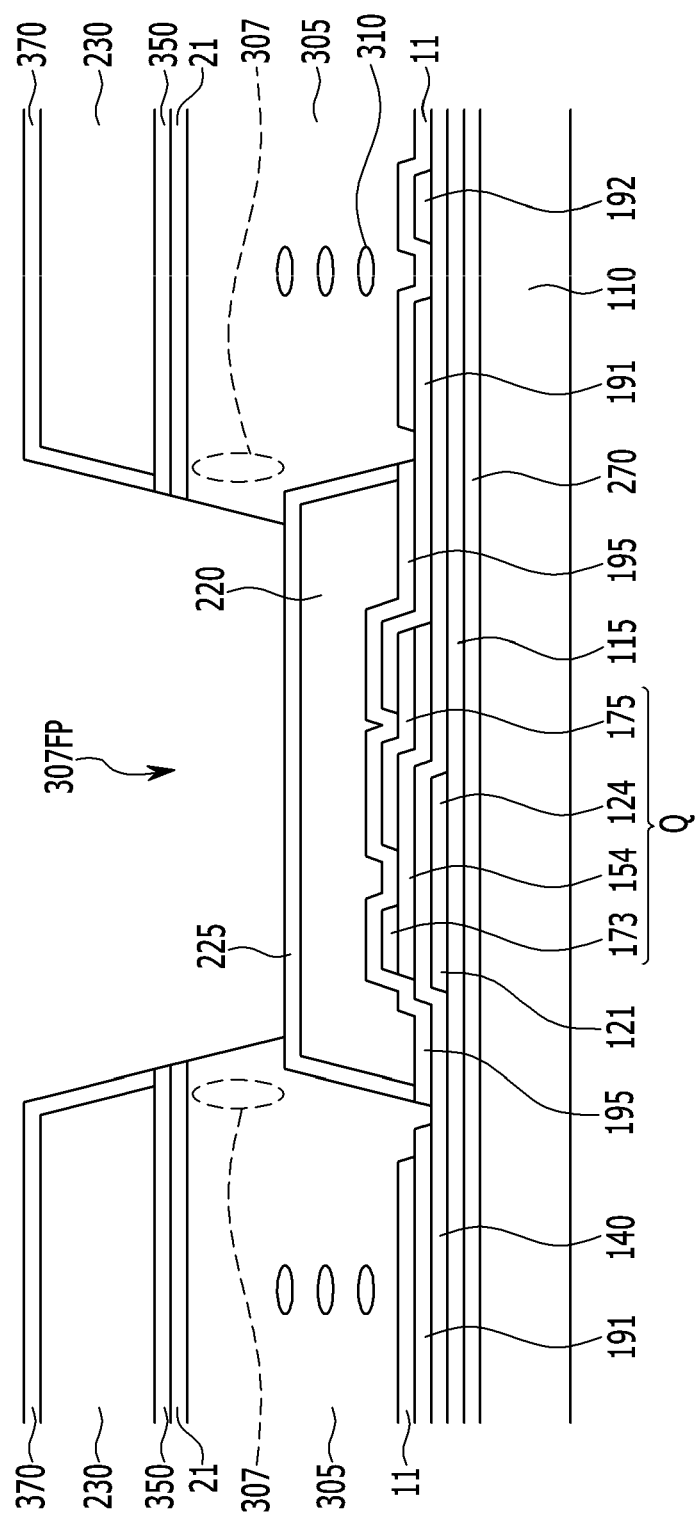
Figure 24:
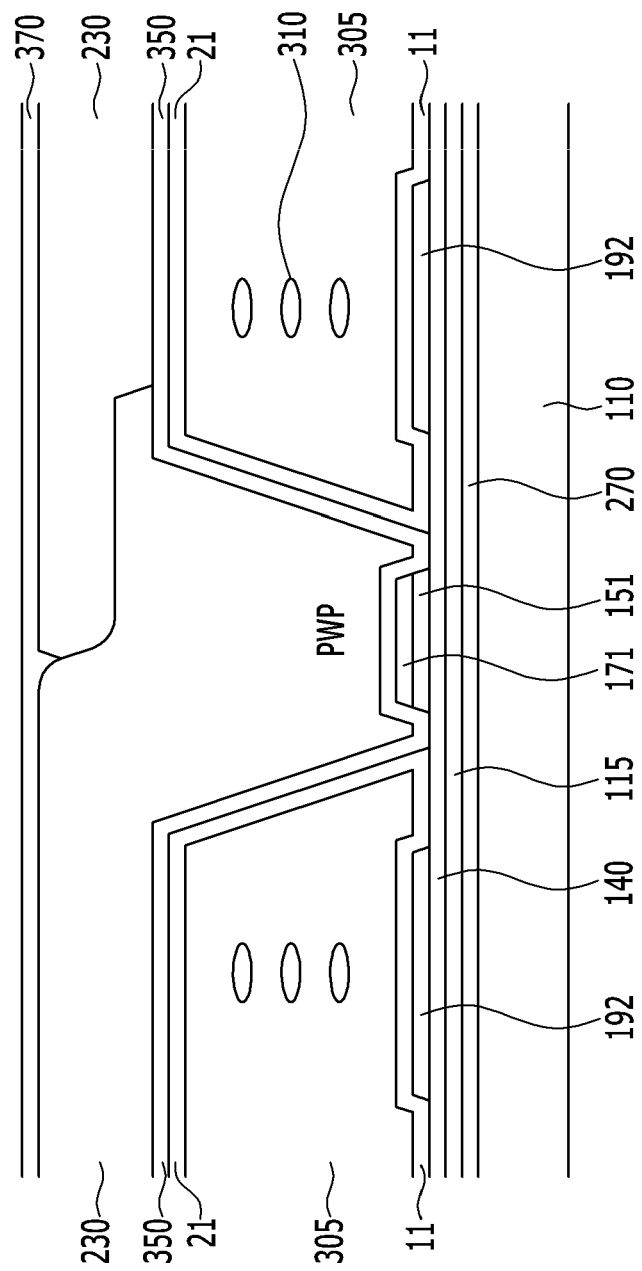

Referring to FIGS. 23 and 24, the alignment material is injected into the micro cavities 305 through the inlets 307 to form the lower alignment layer 11 and the upper alignment layer 21. In detail, after the alignment materials including solid contents and solvents are injected in the micro cavities 305 through the inlets 307, a bake process is performed. Here, the lower alignment layer 11 is formed on the pixel electrodes 191, and the upper alignment layer 21 is formed on one surface of the lower insulating layer 350.

Next, the liquid crystal material including the liquid crystal molecules 310 is injected into the micro cavities 305 through the inlets 307 using an inkjet method, or the like.

Referring to FIG. 4, the reference electrode pad 280 is formed on the gate insulating layer 140. The reference electrode pad 280 contact the reference electrode 270 through the reference electrode exposing hole 271.

Referring to FIGS. 2 and 3, the capping layer 390 is formed on the upper insulating layer 370 so as to cover the inlets 307. The capping layer 390 may cover the liquid crystal inlet 307FP. The capping layer 390 may be formed by pushing a capping material from one edge of the substrate 110 to the other edge thereof using a bar coater and then simultaneously ultraviolet-curing the capping material.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A liquid crystal display comprising:
   a substrate;
   a reference electrode disposed on the substrate;
   a reference electrode passivation layer disposed on the reference electrode;
   a thin film transistor disposed on the reference electrode passivation layer;
   a pixel electrode connected to the thin film transistor;
   a pixel electrode passivation layer disposed on a portion of the pixel electrode;
   a light blocking member disposed on the pixel electrode passivation layer;
   a color filter disposed so as to face the pixel electrode;
   a micro cavity disposed between the pixel electrode and the color filter; and
   a liquid crystal material disposed in the micro cavity.

2. The liquid crystal display of claim 1, wherein the pixel electrode directly contacts one terminal of the thin film transistor.

3. The liquid crystal display of claim 2, wherein the pixel electrode passivation layer and the light blocking member are disposed on the thin film transistor.

4. The liquid crystal display of claim 3, further comprising an overcoat covering the light blocking member.

5. The liquid crystal display of claim 4, wherein a side surface of the overcoat is disposed on an extension line of a side surface of the pixel electrode passivation layer.

6. The liquid crystal display of claim 1, further comprising a partition wall part partitioning the micro cavity,
   wherein the partition wall part is formed by the color filter.

7. The liquid crystal display of claim 6, further comprising a data line connected to the thin film transistor,
   wherein the partition wall part is overlapped with the data line.

8. The liquid crystal display of claim 1, wherein the pixel electrode passivation layer is disposed under the light blocking member to cover the pixel electrode.

9. The liquid crystal display of claim 8, wherein a side surface of the overcoat is positioned on an extension line of a side surface of the pixel electrode passivation layer.

10. The liquid crystal display of claim 9, wherein the pixel electrode passivation layer is not disposed on areas other than an area corresponding to the light blocking member.

11. The liquid crystal display of claim 10, wherein the pixel electrode passivation layer is made of a silicon nitride (SiNx) or a silicon oxide (SiOx).

12. A method for manufacturing a liquid crystal display, comprising:
    sequentially forming a reference electrode and a reference electrode passivation layer on a substrate including a display area displaying an image and a peripheral area disposed in the vicinity of the display area;
    forming a gate line including a gate electrode on the reference electrode passivation layer;
    forming a gate insulating layer on the gate line and the reference electrode passivation layer;
    forming a semiconductor layer, a data line including a source electrode, and a drain electrode on the gate insulating layer;
    forming a pixel electrode on the drain electrode and the gate insulating layer;
    forming a preliminary pixel electrode passivation layer on the pixel electrode, the data line, the drain electrode, and the gate insulating layer;
    forming a light blocking member on the preliminary pixel electrode passivation layer;
    forming an insulating layer on the light blocking member and the preliminary pixel electrode passivation layer;
    forming a pixel electrode passivation layer and an overcoat, respectively, by simultaneously etching the preliminary pixel electrode passivation layer and the insulating layer;
    forming a sacrificial layer on the pixel electrode and the overcoat;
    sequentially forming a lower insulating layer, a color filter, and an upper insulating layer on the sacrificial layer;
    exposing the sacrificial layer;
    forming a micro cavity between the lower insulating layer and the pixel electrode by removing the sacrificial layer;
    injecting a liquid crystal material into the micro cavity; and
    forming a capping layer on the upper insulating layer to seal the micro cavity.

13. The method for manufacturing a liquid crystal display of claim 12, wherein the forming of the pixel electrode passivation layer and the overcoat further includes
    forming a reference electrode exposing hole exposing a portion of the reference electrode by etching the reference electrode passivation layer and the gate insulating layer of the peripheral area.

14. The method for manufacturing a liquid crystal display of claim 13, wherein etching the preliminary pixel electrode passivation layer and the insulating layer and etching the reference electrode passivation layer and the gate insulating layer of the peripheral area use a same mask.

15. The method for manufacturing a liquid crystal display of claim 14, further comprising:
    before the forming of the capping layer,
    forming a reference electrode pad on the gate insulating layer, the reference electrode pad contacting the reference electrode through the reference electrode exposing hole.

16. The method for manufacturing a liquid crystal display of claim 15, wherein the overcoat covers the light blocking member, and
    the pixel electrode passivation layer is formed between the light blocking member and the pixel electrode.

* * * * *